United States Patent
Shimuta et al.

(10) Patent No.: US 9,058,873 B2
(45) Date of Patent: Jun. 16, 2015

(54) MEMORY ELEMENT HAVING ION SOURCE LAYERS WITH DIFFERENT CONTENTS OF A CHALCOGEN ELEMENT

(75) Inventors: Masayuki Shimuta, Kanagawa (JP); Shuichiro Yasuda, Kanagawa (JP); Tetsuya Mizuguchi, Kanagawa (JP); Kazuhiro Ohba, Miyagi (JP); Katsuhisa Aratani, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 118 days.

(21) Appl. No.: 13/527,764

(22) Filed: Jun. 20, 2012

(65) Prior Publication Data

US 2013/0001496 A1    Jan. 3, 2013

(30) Foreign Application Priority Data

Jun. 30, 2011    (JP) .................................. 2011-146113

(51) Int. Cl.
| | |
|---|---|
| H01L 29/02 | (2006.01) |
| G11C 13/00 | (2006.01) |
| H01L 45/00 | (2006.01) |
| H01L 27/24 | (2006.01) |

(52) U.S. Cl.
CPC ........ *G11C 13/0007* (2013.01); *G11C 13/0011* (2013.01); *G11C 2213/55* (2013.01); *H01L 45/085* (2013.01); *H01L 45/1233* (2013.01); *H01L 45/1266* (2013.01); *H01L 45/144* (2013.01); *H01L 45/146* (2013.01); *H01L 27/2436* (2013.01); *H01L 27/2472* (2013.01)

(58) Field of Classification Search
USPC .............................. 257/2–5, E47.001, E29.17
See application file for complete search history.

(56) References Cited

U.S. PATENT DOCUMENTS

| | | | | |
|---|---|---|---|---|
| 7,061,004 | B2 * | 6/2006 | Campbell | 257/2 |
| 2010/0259967 | A1 * | 10/2010 | Yasuda et al. | 365/148 |
| 2011/0194329 | A1 * | 8/2011 | Ohba et al. | 365/148 |
| 2011/0278530 | A1 * | 11/2011 | Campbell | 257/3 |
| 2013/0320292 | A1 * | 12/2013 | Nakajima | 257/5 |

FOREIGN PATENT DOCUMENTS

| | | |
|---|---|---|
| DE | 102004052645 A1 | 5/2006 |
| JP | 2007-189087 | 7/2007 |
| JP | 2008-135659 | 6/2008 |

(Continued)

OTHER PUBLICATIONS

European Search Report for related EP Application No. EP12004603 dated Mar. 19, 2013.

(Continued)

*Primary Examiner* — Matthew E Warren
(74) *Attorney, Agent, or Firm* — Dentons US LLP

(57) ABSTRACT

A memory element includes: a first electrode, a memory layer, and a second electrode in this order. The memory layer includes a resistance change layer provided on the first electrode side, and an ion source layer containing one or more of metallic elements, and the ion source layer being provided on the second electrode side. The ion source layer includes a first ion source layer and a second ion source layer, the first ion source layer containing one or more of chalcogen elements of tellurium (Te), sulfur (S), and selenium (Se) and being provided on the resistance change layer side, and the second ion source layer containing the chalcogen element with a content different from a content in the first ion source layer and being provided on the second electrode side.

12 Claims, 10 Drawing Sheets

(56) References Cited

FOREIGN PATENT DOCUMENTS

| | | |
|---|---|---|
| JP | 2009-043757 | 2/2009 |
| JP | 2009-043873 | 2/2009 |
| JP | 2009-049322 | 3/2009 |

OTHER PUBLICATIONS

Japanese Office Examination Report issued in connection with related Japanese patent application No. 2011-146113 dated Nov. 25, 2014.

* cited by examiner

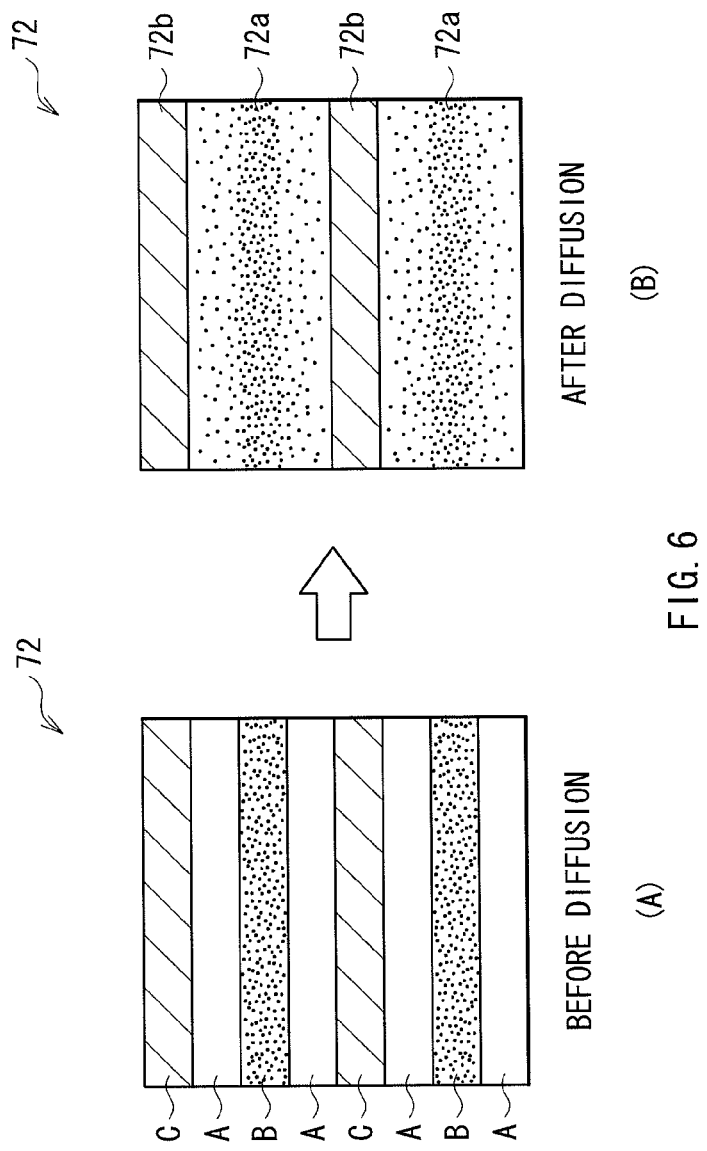

FIG. 7A  SAMPLE 1-1 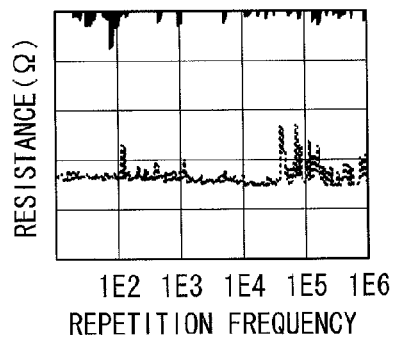 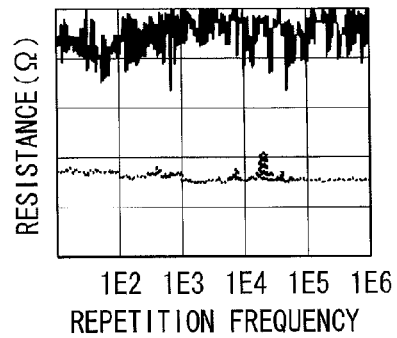
FIG. 7B  SAMPLE 1-2 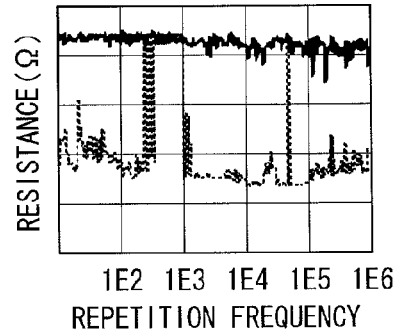 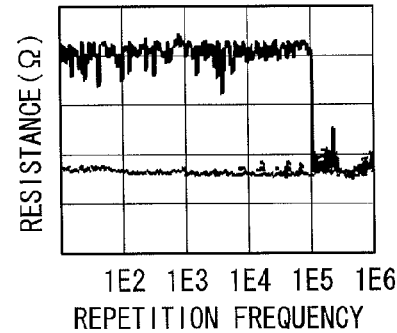
FIG. 7C  SAMPLE 1-3 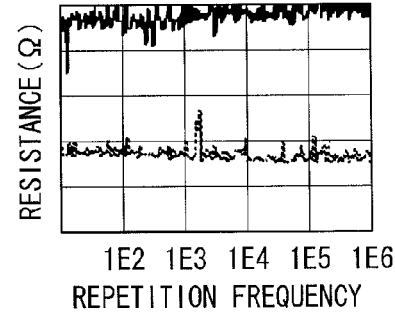 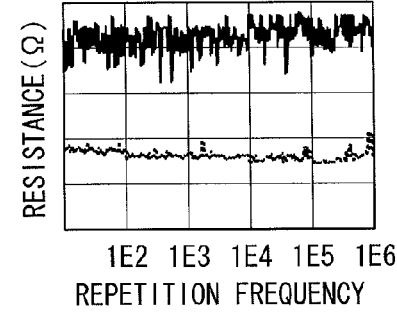
FIG. 7D  SAMPLE 1-4 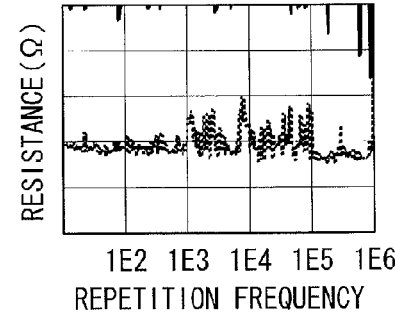 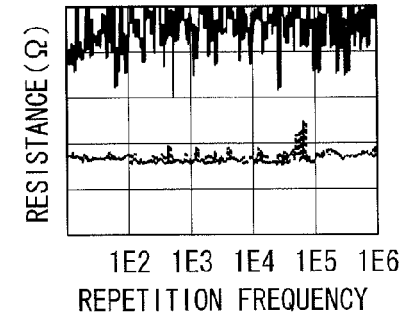

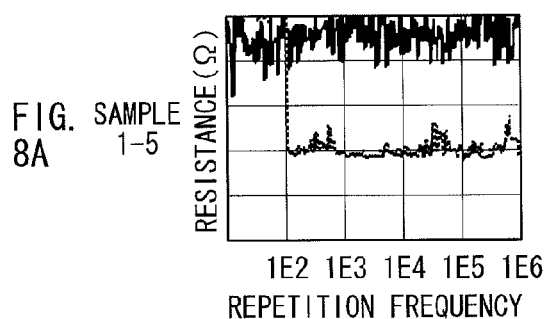
FIG. 8A  SAMPLE 1-5
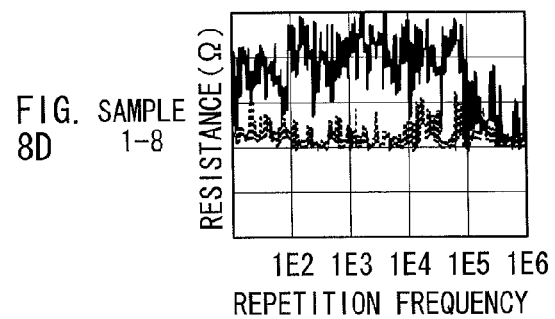
FIG. 8D  SAMPLE 1-8
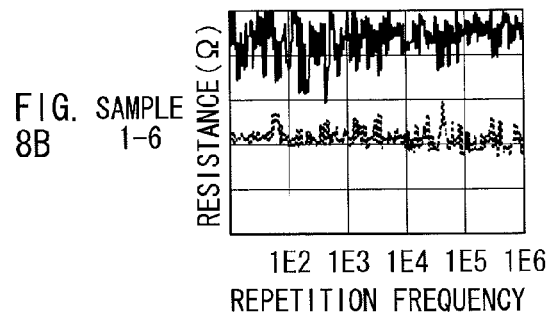
FIG. 8B  SAMPLE 1-6
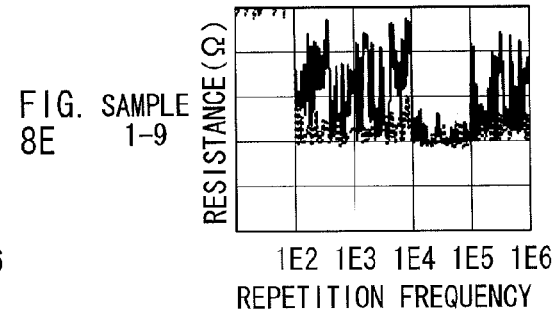
FIG. 8E  SAMPLE 1-9
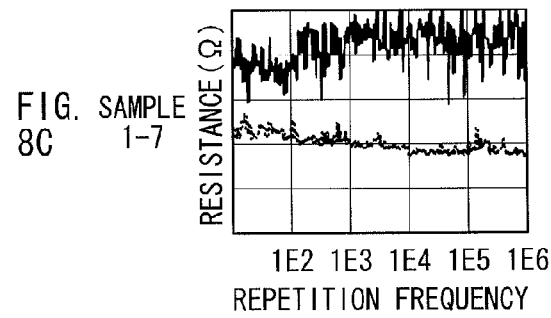
FIG. 8C  SAMPLE 1-7

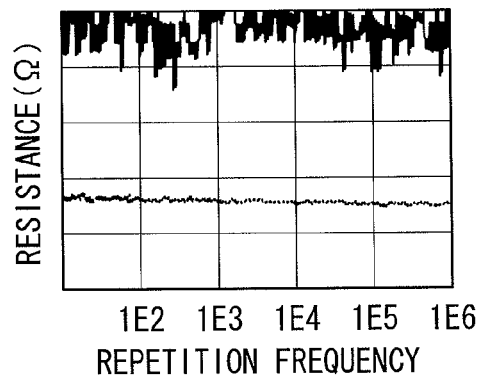
FIG. 9A  SAMPLE 1-10
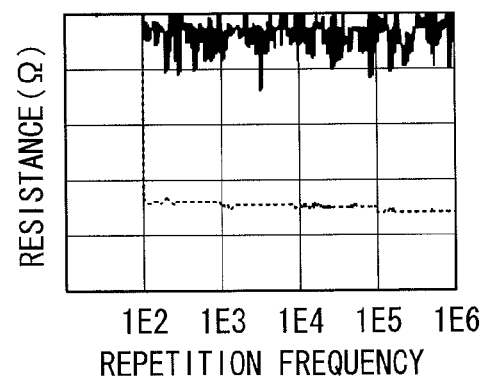
FIG. 9B  SAMPLE 1-11
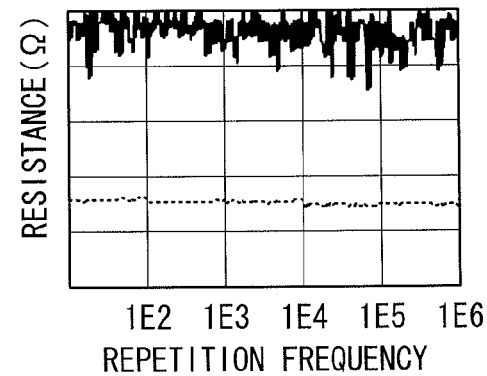
FIG. 9C  SAMPLE 1-12

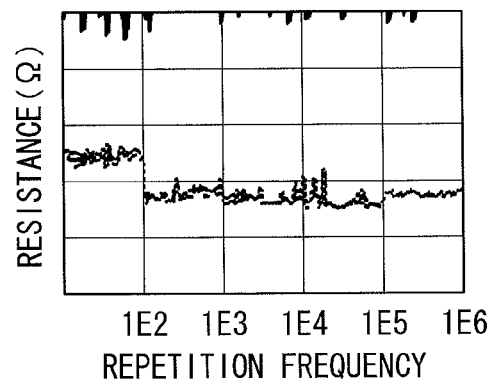
FIG. 10A  SAMPLE 1-13
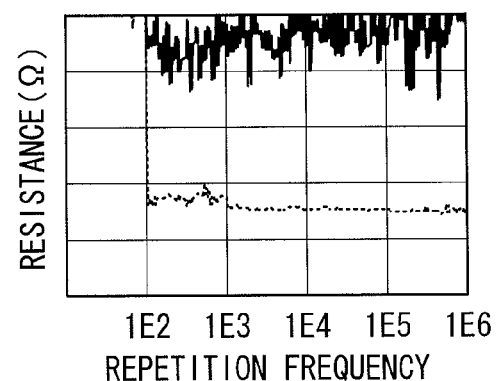
FIG. 10B  SAMPLE 1-14
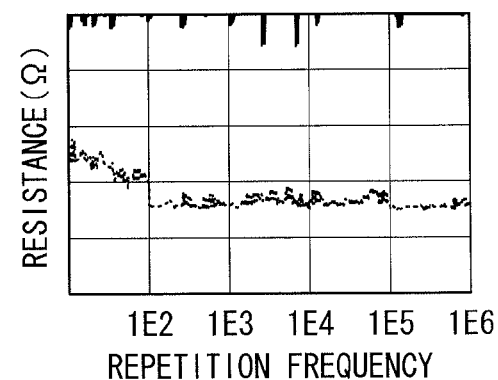
FIG. 10C  SAMPLE 1-15

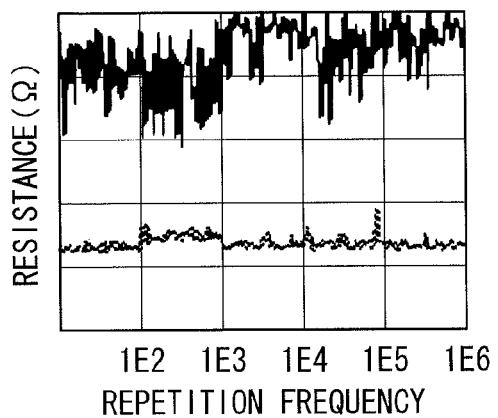
FIG. 11A  SAMPLE 2-1
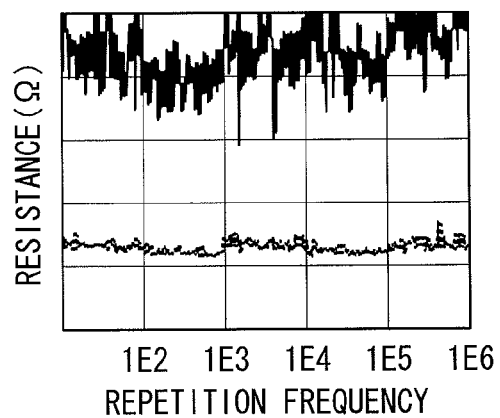
FIG. 11B  SAMPLE 2-2
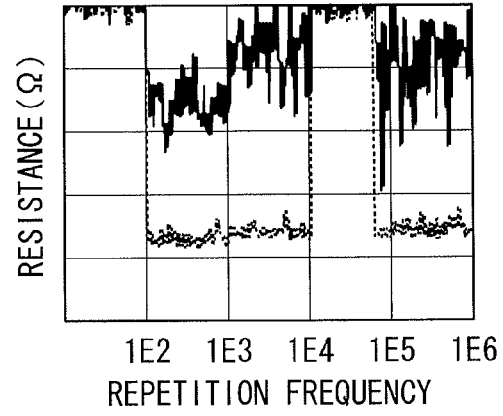
FIG. 11C  SAMPLE 2-3

MEMORY ELEMENT HAVING ION SOURCE LAYERS WITH DIFFERENT CONTENTS OF A CHALCOGEN ELEMENT

BACKGROUND

The present disclosure relates to a memory element storing information based on any change of electrical characteristics observed in a memory layer including an ion source layer and a resistance change layer, to a method of manufacturing the same, and to a memory device.

In information devices such as computers, a random access memory widely in use is a DRAM (Dynamic Random Access Memory), which operates at a high speed and is high in density. The DRAM is, however, high in manufacturing cost due to the complicated manufacturing process thereof compared with that of a logic circuit LSI (Large Scale Integrated circuit) or of a signal processing circuit generally used for electronic devices. The DRAM is also expected for a frequent refresh operation, i.e., an operation for reading any written information (data), and amplifying again the information for rewriting thereof as is a volatile memory from which any stored information is lost when power is turned off.

As a nonvolatile memory from which information is not erased even if the power is turned off, previously proposed are a flash memory, a FeRAM (Ferroelectric Random Access Memory), an MRAM (Magnetoresistive Random Access Memory), and others. Such types of memories are able to keep any written information for a long time with no supply of power. However, such types of memories each have advantages and disadvantages. Specifically, the flash memory is indeed high in packaging density, but is disadvantageous in terms of operation speed. The FeRAM has the limitations for microfabrication to achieve a higher packaging density, and also has a disadvantage in a manufacturing process. The MRAM has a disadvantage in terms of power consumption.

For overcoming such disadvantages, a next-generation nonvolatile memory currently proposed includes a ReRAM (Resistive Random Access Memory) or a PCM (Phase Change Memory) as a memory element of a new type (for examples, see Japanese Patent Application No. 2006-322188 and Japanese Unexamined Patent Application Publication No. 2009-43873.

SUMMARY

However, when the memory element described above is left for a long time in the state of recording (low-resistance state) or in the state of erasing (high-resistance state), or when the memory element described above is left as it is in the atmosphere at the temperature higher than the room temperature, there is a disadvantage of possibly causing data loss because a resistance change layer shows a change of resistance value.

It is thus desirable to provide a memory element with improved heat resistance, a method of manufacturing the same, and a memory device.

According to an embodiment of the present technology, there is provided a memory element, including: a first electrode, a memory layer, and a second electrode in this order. The memory layer includes a resistance change layer provided on the first electrode side, and an ion source layer containing one or more of metallic elements, and the ion source layer being provided on the second electrode side. The ion source layer includes a first ion source layer and a second ion source layer, the first ion source layer containing one or more of chalcogen elements of tellurium (Te), sulfur (S), and selenium (Se) and being provided on the resistance change layer side, and the second ion source layer containing the chalcogen element with a content different from a content in the first ion source layer and being provided on the second electrode side.

According to an embodiment of the present technology, there is provided a memory device, including: a plurality of memory elements each including a first electrode, a memory layer, and a second electrode in this order; and a pulse application section applying a voltage or current pulse selectively to the memory elements. The memory layer includes a resistance change layer provided on the first electrode side, and an ion source layer containing one or more of metallic elements, and the ion source layer being provided on the second electrode side. The ion source layer includes a first ion source layer and a second ion source layer, the first ion source layer containing one or more of chalcogen elements of tellurium (Te), sulfur (S), and selenium (Se) and being provided on the resistance change layer side, and the second ion source layer containing the chalcogen element with a content different from a content in the first ion source layer and being provided on the second electrode side.

According to an embodiment of the present technology, there is provided a method of manufacturing a memory element. The method includes: forming a first electrode on a substrate; forming a resistance change layer on the first electrode; forming, on the resistance change layer, a first ion source layer containing a metallic element and one or more of chalcogen elements of tellurium (Te), sulfur (S), and selenium (Se); forming, on the first ion source layer, a second ion source layer containing the chalcogen element with a content different from a content in the first ion source layer; and forming a second electrode on the first ion source layer.

With the memory element (memory device) according to the embodiment of the present technology, when voltage or current pulses of "positive direction" (for example, the first electrode side is at a negative potential, and the second electrode side is at a positive potential) are applied with respect to the element in the initial state (the high-resistance state), any metallic element contained in the ion source layer is ionized and diffused in the resistance change layer, and then is deposited by bonding with electrons at the first electrode, or remains in the resistance change layer and forms an impurity level. As a result, a low-resistance section (conductive path) containing the metallic element is formed in the memory layer, thereby decreasing the resistance of the resistance change layer (state of recording). When voltage pulses of "negative direction" (for example, the first electrode side is at a positive potential, and the second electrode side is at a negative potential) are applied with respect to the element in the low-resistance state as such, the metallic element that has been deposited on the first electrode is ionized, and then is dissolved into the ion source layer. As a result, the conductive path containing the metallic element disappears, and the resistance change layer is increased in resistance (initial state or state of erasing).

Herein, the ion source layer contains one or more of chalcogen elements of tellurium (Te), sulfur (S), and selenium (Se). The ion source layer is in the multi-layer structure including the first ion source layer provided on the resistance change layer side, and the second ion source layer provided on the second electrode side with a content of the chalcogen element(s) different from that in the first ion source layer. With such a structure, the ion source layer becomes resistant to deterioration.

According to the memory element, the method of manufacturing the same, and the memory device according to the embodiments of the present technology, the ion source layer is in the multi-layer structure including the first and second ion source layers each with a different content of chalcogen element(s). This accordingly makes the ion source layer resistant to deterioration, and the memory element becomes more resistant to heat. In other words, the resulting memory device is provided with a high reliability.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIG. 6 is a schematic diagram for illustrating the density distribution in a first ion source layer of the memory element according to the second embodiment of the present disclosure.

FIGS. 7A to 7D are each a diagram showing repetition characteristics according to Example 1.

FIGS. 8A to 8E are each a diagram also showing the repetition characteristics according to Example 1.

FIGS. 9A to 9C are each a diagram also showing the repetition characteristics according to Example 1.

FIGS. 10A to 10C are each a diagram also showing the repetition characteristics according to Example 1.

FIGS. 11A to 11C are each a diagram showing repetition characteristics according to Example 2.

DETAILED DESCRIPTION OF THE PREFERRED EMBODIMENTS

In the below, embodiments of the present disclosure are described in the following order by referring to the accompanying drawings.

[First Embodiment]
 1. Memory Element (Memory element in which ion source layer includes first and second ion source layers)
 2. Method of Manufacturing Memory Element
 3. Memory Device

[Modification]
 [Memory element including two resistance change layers disposed one on the other]
[Second Embodiment]
 [Memory element in which a second ion source layer has the multi-layer structure]

EXAMPLES

First Embodiment

Memory Element

Figure 1:
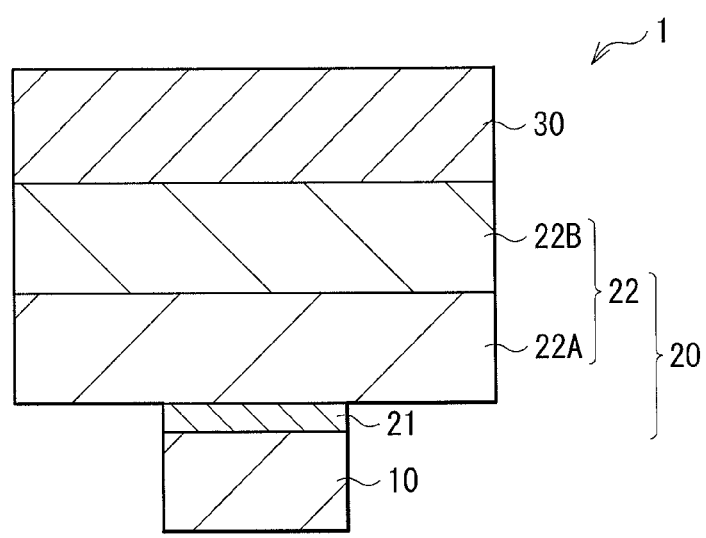
FIG. 1 is a cross-sectional diagram showing the configuration of a memory element according to a first embodiment of the present disclosure.

FIG. 1 is a cross-sectional diagram showing the configuration of a memory element 1 according to a first embodiment of the present disclosure. This memory element 1 includes a lower electrode 10 (first electrode), a memory layer 20, and an upper electrode 30 (second electrode) in this order.

The lower electrode 10 is provided on a silicon substrate 41 formed with a CMOS (Complementary Metal Oxide Semiconductor) circuit as will be described later (FIG. 4), for example, thereby serving as a connection section with the portion of the CMOS circuit. This lower electrode 10 is made of a material for wiring use in the semiconductor process, e.g., tungsten (W), tungsten nitride (WN), copper (Cu), aluminum (Al), molybdenum (Mo), tantalum (Ta), and silicide. When the lower electrode 10 is made of a material (for example, Cu) that possibly causes ion conduction in an electric field, the surface of the lower electrode 10 may be covered with a material that hardly causes ion conduction or thermal diffusion, e.g., W, WN, titanium nitride (TiN), and tantalum nitride (TaN). When an ion source layer 22 that will be described later contains Al, preferably used is a metal film containing one or more of chromium (Cr), W, cobalt (Co), Si, gold (Au), palladium (Pd), Mo, iridium (Ir), titanium (Ti), and others that are more resistant to ionization than Al, or an oxide or nitride film thereof.

The memory layer 20 is configured by a resistance change layer 21, and the ion source layer 22. The resistance change layer 21 is on the lower electrode 10 side, and in this example, is in contact with the lower electrode 10. This resistance change layer 21 serves as a barrier against electric conduction. The resistance change layer 21 shows a change of resistance value when a predetermined level of voltage is applied between the lower and upper electrodes 10 and 30. The resistance change layer 21 may be made of any type of substance as long as it is an insulator or a semiconductor that remains stable even if it is in contact with the ion source layer 22 that will be described later. Such a material is specifically exemplified by an oxide, nitride, or fluoride including one or more of rare-earth elements such as Gd (gadolinium), and Al, Mg (magnesium), Ta, Si (silicon), and others. Other than these materials, a possible option for use is a compound containing a chalcogen element including tellurium (Te), sulfur (S), and selenium (Se), which behave as anionic components. To be specific, such a compound is exemplified by AlTe, MgTe, or ZnTe with the content of Te, and AlTeN also with the content of nitrogen (N), for example.

The resistance change layer 21 preferably has the initial resistance value of 1 M$\Omega$ or larger, and the resistance value in the state of low resistance is preferably several hundreds of k$\Omega$ or smaller. For reading at a high speed the state of resistance of any microfabricated resistance change memory, the resistance value in the state of low resistance is preferably as low as possible. However, since the resistance value is 40 to 100 k$\Omega$ when writing is performed under the condition of 20 to 50 μA and 2 V, for example, the memory is supposed to have the initial resistance value higher than that value.

The ion source layer 22 is a layer containing an ion conductive material, which is converted into movable ions (cations and anions) that diffuse to the resistance change layer 21. The ion source layer 22 serves as an ion supply source, and is mainly in the amorphous structure. The ion source layer 22 contains one or more of chalcogen elements of Te, S, and Se as an ion conductive material that is anionized. The ion source layer 22 may contain Al as an element of forming oxides on the lower electrode 10 at the time of erasing. The ion source layer 22 also contains one or more of metallic elements. The metallic element(s) in the ion source layer 22 are preferably one or more in a group of metallic elements including Cu, zinc (Zn), silver (Ag), nickel (Ni), cobalt (Co), manganese (Mn), iron (Fe), Ti, Zr, Hf, V, Nb, Ta, Cr, Mo, and W, for example. Some of these metallic elements and Al each have a function as an ion conductive material that is cationized.

The ion source layer 22 preferably contains Zr as a metallic element for amorphization. This is because Zr possibly improves the resistance value retention characteristics in the low-resistance state (state of writing), or in the high-resistance state (initial state or state of erasing). Herein, the low-resistance state is defined as the state of writing, and the high-resistance state as the state of erasing. Cu is a metallic element that is possibly cationized, and a combination of Zr and Cu produces the effect of making amorphous the ion source layer 22 with ease, and of keeping uniform the microstructure of the ion source layer 22.

The ion source layer 22 may be added with any other elements as appropriate. Such elements for addition are exemplified by Mg, germanium (Ge), and Si. Mg is easily cationized, and is added for forming an oxide film by an erasing bias for an increase of resistance with ease. Similarly to Al, Ge makes stable the high-resistance state (state of erasing) with the formation of oxides at the time of erasing, and also contributes to the increase of the repetition frequency. Si is an additive element that decreases the possibility of film peeling during a high-temperature heat treatment for the memory layer 20, and also possibly offers the improvement of the retention characteristics. Si may be added to the ion source layer 22 together with Zr.

As the specific material for the ion source layer 22 as such, exemplified are materials of the composition of ZrTeAl, ZrTeAlGe, CuZrTeAl, CuZrTeAlGe, CuHfTeAl, CuTiTeAl, AgZrTeAl, NiZrTeAl, CoZrTeAl, MnZrTeAl, and FeZrTeAl.

The ion source layer 22 in this embodiment has the structure including first and second ion source layers 22A and 22B that are different in composition. These first and second ion source layers 22A and 22B are disposed one on the other in this order from the resistance change layer 21 side. To be specific, the first ion source layer 22A preferably contains a higher content of chalcogen element(s) than in the second ion source layer 22B. Moreover, the second ion source layer preferably contains a higher content of one or more of metallic elements of Cu, Al, Ge, and Zn than in the first ion source layer. Alternatively, the second ion source layer preferably contains a higher content of one or more of metallic elements in a transition metal group of Ti, Zr, Hf, V, Nb, Ta, Cr, Mo, and W than in the first ion source layer. Furthermore, the first ion source layer preferably contains a lower content of oxygen (O) or N than in the second ion source layer. The first and second ion source layers 22A and 22B may contain the same kinds of elements or not as long as the content thereof varies as described above. The first and second ion source layers 22A and 22B each preferably have the film thickness of 6 nm or more. As to a resistance value, the second ion source layer 22B is preferably lower in value than the first ion source layer 22A. The melting point of the first ion source layer 22A is preferably lower than that of the second ion source layer 22B. With the first and second ion source layers 22A and 22B in the structure as described above, the ion source layer 22 is resistant to deterioration by heat so that the memory element 1 becomes more resistant to heat. Note here that the first and second ion source layers 22A and 22B do not necessarily satisfy all of the conditions described above as long as the condition for the content of a chalcogen element(s) is satisfied.

The upper electrode 30 may be made of a material similar to that of the lower electrode 10, i.e., a well-known material for use of semiconductor wiring, and preferably, be made of a stable material not reacting with the ion source layer 22 even after post-annealing.

With such a memory element 1 of the embodiment, when a voltage or current pulse is applied by a power supply circuit (pulse application section; not shown) via the lower and upper electrodes 10 and 30, the memory layer 20 shows a change of the electrical characteristics (resistance value) thereof, thereby performing information writing, erasing, and reading. In the below, such an operation is described specifically.

First of all, a positive voltage is applied to the memory element 1 such that the upper electrode 30 is at a positive potential, and the lower electrode 10 side is at a negative potential, for example. In response thereto, any metallic element contained in the ion source layer 22 (especially any metallic element that is possibly cationized) is ionized and diffused to the resistance change layer 21, and then is deposited by bonding with electrons on the lower electrode 10 side. As a result, a conductive path (filament) of the metallic element low in resistance as is reduced in the form of metal is formed on the interface between the lower electrode 10 and the memory layer 20. Or the ionized metallic element remains in the resistance change layer 21, and forms an impurity level. With the resistance change layer 21 formed therein with the filament as such, the memory layer 20 is decreased in resistance value, and shows a decrease of resistance value to be lower (to be in the low-resistance state) than that in the initial state (in the high-resistance state).

Thereafter, even if the memory element 1 becomes free of voltage by stopping the application of the positive voltage thereto, the state of low resistance is retained. This means information writing is done. For use in a once-writable memory device, i.e., a so-called PROM (Programmable Read Only Memory), the memory element 1 is completed with recording only by the process of recording described above. On the other hand, for application use in an erasable memory device, i.e., RAM (Random Access Memory), EEPROM (Electronically Erasable and Programmable Read Only Memory), or others, a process of erasing is expected. During the process of erasing, a negative voltage is applied to the memory element 1 such that the upper electrode 30 is at a negative potential, and the lower electrode 10 side is at a positive potential, for example. In response thereto, in the filament formed inside of the memory layer 20, the metallic element is ionized, and then is dissolved into the ion source layer 22 or is bonded with Te or others, thereby forming a compound such as $Cu_2Te$ or CuTe. As a result, the filament made of the metallic element disappears or is decreased in area, and the resistance value thus shows an increase.

Thereafter, even if the memory element 1 becomes free of voltage by stopping the application of the negative voltage thereto, the resistance value therein remains high. This means erasing of any information written thereto is allowed. By repeating such a procedure, the memory element 1 is to be subjected to repeated writing of information and erasing of the written information.

If the state high in resistance value is correlated with information of "0", and if the state low in resistance value is correlated with information of "1", for example, the information of "0" is to be changed to the information of "1" in the process of information recording by the application of a positive voltage, and the information of "1" is to be changed to the information of "0" in the process of information erasing by the application of a negative voltage. Note that, in this example, although the operation of decreasing the resistance of the memory element is correlated with the writing operation and the operation of increasing the resistance thereof is correlated with the erasing operation, the correlation may be inversed.

Described next is the action and preferable content of each element in the ion source layer 22. Herein, the content of each element that will be described later is of the entire ion source layer 22 including the first and second ion source layers 22A and 22B.

When the ion source layer 22 contains Zr, Zr serves as an ionizing element together with the metallic element(s) such as Cu described above, and the resulting filament contains both an easy-to-move element (Cu, for example), and a difficult-to-move element (Zr, for example). Zr is reduced on the cathode electrode during the operation of writing, and in the low-resistance state after the writing, is supposed to form a filament in the form of metal. The filament formed by the reduction of Zr is relatively difficult to dissolve in the ion source layer 22 containing the chalcogen element(s) of S, Se, and Te. Therefore, once the state is put in writing, that is, put in the low-resistance state, the resulting low-resistance state is retained more easily than in the case with the above-described filament containing only the metallic element such as Cu, for example. For example, Cu is formed as a filament by the operation of writing. However, Cu in the form of metal is dissolved easily in the ion source layer 22 containing the chalcogen element(s), and in the state of no application of voltage pulses for writing (in the state of data retention), Cu is ionized again and the state is changed to high resistance. The resulting characteristics of data retention are not thus satisfactory. On the other hand, combining Zr with any appropriate content of Cu facilitates amorphization, and keeps uniform the microstructure of the ion source layer 22, thereby contributing to the improvement of the characteristics of resistance value retention.

Also for retention of the high-resistance state during erasing, the content of Zr brings the following effect. When a filament to be formed contains Zr, for example, and when Zr is dissolved in the ion source layer 22 again as ions, due to the lower ion mobility of Zr at least than Cu, the Zr ions are resistant to move even if the temperature is increased, or even if they are left as they are for a long time. Therefore, Zr in the form of metal is not easily deposited on the cathode electrode, and thus remains high in resistance even if it is kept in the temperature higher than the room temperature or if it is left as it is for a long time.

Moreover, when the ion source layer 22 contains Al, if the upper electrode is biased to a negative potential as a result of the erasing operation, formed is an oxide film stable on the interface between the ion source layer 22 behaving like a solid-electrolyte layer and the anode electrode. This accordingly stabilizes the high-resistance state (state of erasing). This also contributes to the increase of the repetition frequency considering the self-reproduction of the resistance change layer. Herein, Al is surely not the only option, and Ge or others acting similar thereto may be also used.

As such, when the ion source layer 22 contains Zr, Al, Ge, and others, compared with the previous memory element not containing such elements, the resulting memory element has the improved characteristics of wide-range resistance value retention and of high-speed operation of writing and erasing, the improved low-current operation, and the increased repetition frequency. Moreover, if any resistance state intermediate between high and low is created through adjustment of an erasing voltage during a change of resistance from low to high, for example, the resulting intermediate state is to be retained with a good stability. Accordingly, the resulting memory is capable not only of binary storage but also of multilevel storage. Herein, such an intermediate state is possibly created also through adjustment of the amount of atoms for deposition by changing a write current during a change of resistance from high to low.

Such various characteristics important for the operation of memory, i.e., the characteristics of operation of writing and erasing with voltage application, the characteristics of resistance value retention, and the repetition frequency of operation, vary depending on the addition content of Al, Zr, Cu, and Ge.

When the content of Al is too much, for example, the Al ions become easy to move, thereby creating the state of writing by reduction of the Al ions. Since Al is not stable enough in the form of metal in the chalcogenide solid electrolyte, the characteristics of low-resistance writing state retention are degraded. On the other hand, when the content of Al is not enough, the effect of improving the erasing operation itself or the characteristics of high-resistance region retention is impaired, thereby decreasing the repetition frequency. In consideration thereof, the content of Al in the ion source layer 22 is preferably 27.7 atomic % or more, and more preferably, 47.7 atomic % or less.

If the content of Zr is too much, for example, the resulting ion source layer 22 is decreased too much in resistance value, thereby failing in voltage application effectively to the ion source layer 22, or resulting in a difficulty in dissolving Zr in the chalcogenide layer. This especially causes a difficulty in erasing, and the threshold voltage for erasing is increased based on the addition content of Zr. If the content of Zr is all too much, this results in a difficulty also in writing, that is, a difficulty in decreasing of resistance. On the other hand, if the addition content of Zr is not enough, the effect of improving the characteristics of wide-range resistance value retention as described above is impaired.

Although adding an appropriate content of Cu to the ion source layer 22 indeed facilitates amorphization, if the content thereof is too much, Cu in the form of metal degrades the characteristics of writing retention or adversely affects the speed of the writing operation as is not stable enough in the ion source layer 22 containing the chalcogen element(s). Whereas a combination of Zr and Cu produces the effect of making amorphous the ion source layer 22 with ease, and of keeping uniform the microstructure of the ion source layer 22. This accordingly prevents the material components in the ion source layer 22 from becoming not uniform by the repeated operation, thereby increasing the repetition frequency and improving the retention characteristics. When the content of Zr in the ion source layer 22 is appropriate, the filament of metal zirconium (Zr) is supposed to remain as it is in the resistance change layer 21 even if the filament made of Cu is dissolved again into the ion source layer 22, and thus the state of low resistance remains as it is. As such, the characteristics of writing retention are not affected.

For the effect produced in combination of Zr and Cu as above, the total content of Zr and Cu in the ion source layer 22 is preferably in the range from 23.5 atomic % to 37 atomic % both inclusive. The content of only Zr in the ion source layer 22 is preferably 9 atomic % or more, and more preferably, is 18.5 atomic % or less.

Herein, Ge is not necessarily contained, but when Ge is to be added, the content thereof is preferably 15 atomic % or less considering that too much content of Ge degrades the characteristics of writing retention.

Note here that, virtually, the characteristics of the memory element 1 are dependent on the composition ratio between Zr and Te (chalcogen element). Accordingly, the composition ratio between Zr and Te preferably falls within the following range.

Composition Ratio of Zr(Atomic %)/Composition
Ratio of Te(Atomic %)=0.3 to 0.84

This is not necessarily evident, but since Cu has the degree of dissociation lower than that of Zr, and since the resistance value of the ion source layer 22 is determined by the composition ratio between Zr and Te, as long as the composition ratio between Zr and Te falls within the above-described range, the resistance value remains suitable. This thus seems because the bias voltage applied to the memory element 1 works effectively to the portion of the resistance change layer 21. The content of only the chalcogen element is preferably 20.7 atomic % or more but is 42.7 atomic % or less.

When the value does not fall within the range described above, for example, when the equivalence ratio is too large, the balance between the cations and anions is lost, and thus among the existing metallic elements, any element not ionizing is increased in amount. Therefore, the filament generated by the operation of writing during the operation of erasing may not be eliminated efficiently. Similarly, when the anion element exists too much because the equivalence ratio is too small, the filament in the form of metal generated by the operation of writing is not inclined to remain in the form of metal. The characteristics of writing state retention thus seem to be impaired.

Herein, the metallic element contained in the ion source layer 22 is surely not restrictive to those described above, and another option may be ZrTeMg including Mg as an alternative to Al. As for the ionizing metallic element, any similar additive element is possibly used even if a transition metallic element selected for use is not Zr but Ti or Ta, and a possible option is TaTeAlGe. Moreover, as for the ion conductive material, Te is surely not restrictive, and sulfur (S), selenium (Se), or iodine (I) may be also used, and specific examples include ZrSAl, ZrSeAl, ZrIAl, CuGeTeAl, and others. Note that Al is not necessarily contained, and CuGeTeZr or others may be also used.

Moreover, the possibility of film peeling in the memory layer 20 at the time of a high-temperature heat treatment is decreased also with an addition of Si, for example. Si is an additive element that possibly offers also the improvement of the retention characteristics, and is preferably added to the ion source layer 22 together with Zr. Herein, if the content of Si for addition is not enough, the effect of reducing the possibility of film peeling by the addition of Si is not sufficiently produced, and if the content thereof is too much, the resulting memory operation characteristics are not satisfactory enough. In consideration thereof, the content of Si in the ion source layer 22 is preferably in the range of about 10 to 45 atomic % to produce the effect of preventing the film peeling, and to have the satisfactory memory operation characteristics.

Moreover, when a chalcogen element is used to the resistance change layer 21, by using any metallic element (M) that is more likely to react with the chalcogen element (for example, Te), the resulting ion source layer 22 may be in the multi-layer structure of Te/Ion Source Layer (containing the metallic element M). If this is the structure, with a heat treatment after the film formation, the resulting structure is stabilized as MTe/Ion Source Layer 22. The element more likely to react with Te is exemplified by Al, magnesium (Mg), and others. This structure accordingly decreases the possibility of film peeling between the resistance change layer 21 and the ion source layer 22.

In the below, the method of manufacturing the memory element 1 in the embodiment is described.

First of all, on a substrate formed with a CMOS circuit such as selection transistor, the lower electrode 10 made of TiN is formed, for example. Thereafter, if appropriate, any oxides or others on the surface of the lower electrode 10 are removed by reverse sputtering, for example. Next, the formation of layers is performed up to the upper electrode 30 including the resistance change layer 21, and the ion source layer 22 (first and second ion source layers 22A and 22B) in succession through exchange of targets in a device for sputtering. The targets herein are those each with the composition adapted for the material of the corresponding layer. The diameter of the electrode is 50 to 300 nmϕ. A film of alloy is formed at the same time using a target of a component element.

After the formation of layers up to the upper electrode 30, a wiring layer (not shown) is formed for connection to the upper electrode 30, and a contact section is connected to achieve a common potential among all of the memory elements 1. Thereafter, the layered film is subjected to a post-annealing process. As such, the memory element 1 of FIG. 1 is completed.

In this memory element 1, as described above, a voltage is so applied that the upper electrode 30 is at a positive potential and the lower electrode 10 is at a negative potential, thereby forming a filament on the interface between the lower electrode 10 and the resistance change layer 21. This accordingly decreases the resistance value of the resistance change layer 21 so that writing is performed. Next, to each of the upper and lower electrodes 30 and 10, applied this time is a voltage whose polarity is opposite to that applied thereto for writing. In response thereto, the metallic element in the filament formed inside of the resistance change layer 21 is ionized again, and then is dissolved into the ion source layer 22. This accordingly increases the resistance value of the resistance change layer 21 so that erasing is performed.

Similarly to the memory element 1 in this embodiment, in a previous memory element including a lower electrode, a memory layer (a resistance change layer, and an ion source layer), and an upper electrode, the ion source layer is of the single composition in its entirety. Such an ion source layer is indeed able to decrease the number of manufacturing processes with a shorter time for film formation, but disadvantageously causes data loss due to a change of resistance value by Joule heat that is generated at the time of storage or operation in the temperature atmosphere higher than the room temperature. This seems due to the state change from amorphous to crystalline because of the deterioration of the ion source layer, specifically because the heat facilitates amorphization in the ion source layer.

In order to overcome such a disadvantage, the ion source layer may be put in the multi-layer structure of including layers each made of an individual element contained in the ion source layer. With such a method, however, the layers of different elements are repeatedly stacked one on the other until a predetermined thickness is obtained. This may disadvantageously lengthen the time for film thickness, and impair the productivity.

On the other hand, in this embodiment, the ion source layer 22 is put in the multi-layer structure of the first and second ion source layers 22A and 22B each with a different content of chalcogen element(s). The resulting ion source layer 22 becomes resistant to deterioration by heat with the decreased number of manufacturing processes and a shorter time for film formation.

As described above, with the memory element 1 (and the manufacturing method thereof and the memory device) in this embodiment, the ion source layer 22 includes the first and second ion source layers 22A and 22B each with a different content of chalcogen element(s). These first and second ion source layers 22A and 22B are stacked one on the other in order from the lower electrode 10 side. The ion source layer is thus resistant to deterioration (amorphization) by heat so that the memory element 1 becomes more resistant to heat. In other words, the memory device is provided with a high reliability.

(Memory Device)

By arranging a large number of memory elements 1 described above in rows or in a matrix, for example, a memory device (memory) is possibly configured. At this time, as appropriate, the memory elements 1 may be each connected with a MOS (Metal Oxide Semiconductor) transistor for element selection use or with a diode to configure a memory cell. The resulting memory cells may be then each connected to a sense amplifier, an address decoder, circuits of writing, erasing, and reading, and others by wiring.

Figure 2:
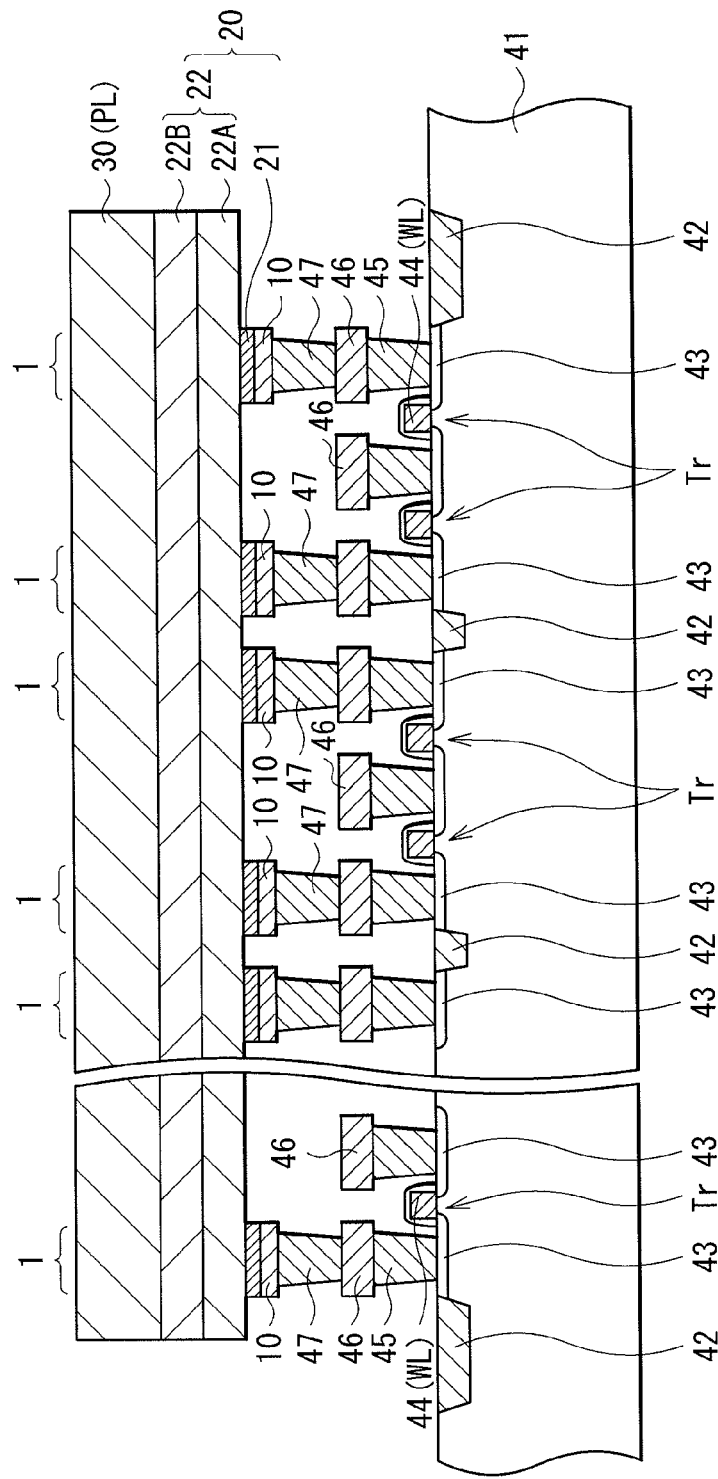
FIG. 2 is a cross-sectional diagram showing the configuration of a memory cell array using the memory element of FIG. 1.
Figure 3:
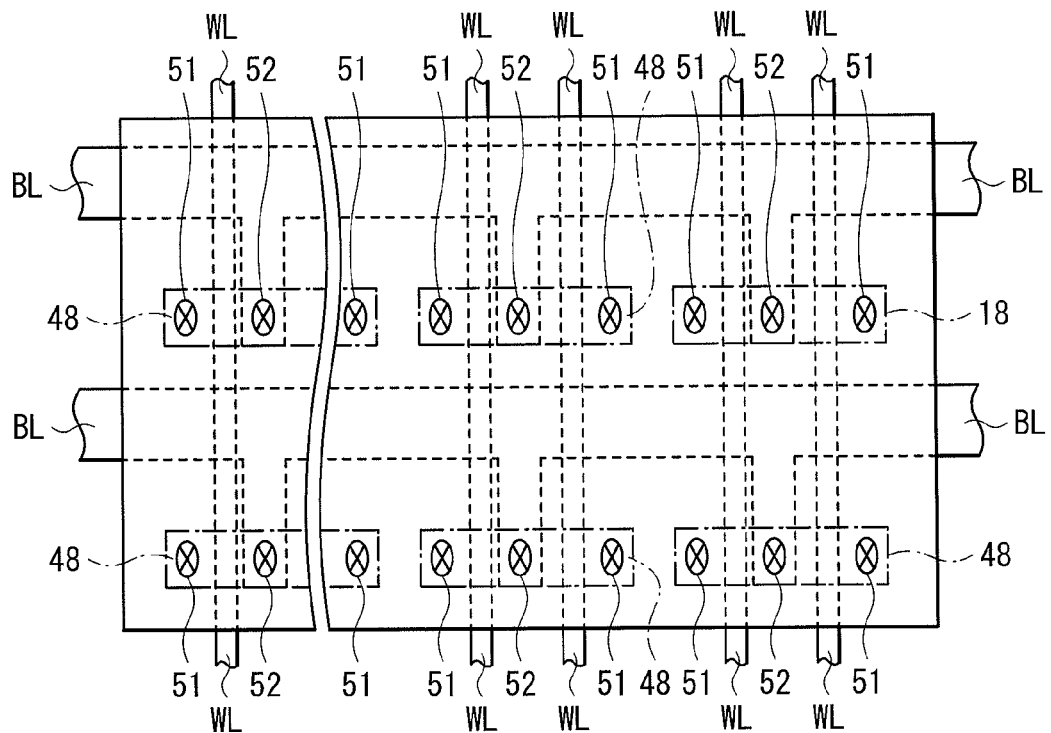
FIG. 3 is a plan view of the memory cell array of FIG. 2.

FIGS. 2 and 3 each show an exemplary memory device (memory cell array) including a large number of memory elements 1 arranged in a matrix. FIG. 2 shows the cross-sectional configuration of the memory cell array, and FIG. 3 shows the configuration thereof in a planar view. In this memory cell array, to each of the memory elements 1, wiring connected to the lower electrode 10 side thereof is so provided as to intersect wiring connected to the upper electrode 30 side thereof, and at the respective intersection points, the memory element 1 is disposed, for example.

The memory elements 1 share the layers, i.e., the resistance change layer 21, the ion source layer 22, and the upper electrode 30. In other words, these layers, i.e., the resistance change layer 21, the ion source layer 22, and the upper electrode 30, are each for the shared use by all of the memory elements 1 (are each one specific layer for use by all of the memory elements 1). The upper electrode 30 is a plate electrode PL for shared use by any adjacent cells.

On the other hand, the lower electrode 10 is provided individually to each of the memory cells so that the memory cells are electrically separated from one another. As such, the memory elements 1 in the memory cells are each defined by position to correspond to its lower electrode 10. The lower electrode 10 is connected to its corresponding MOS transistor Tr for cell selection use, and the memory elements 1 are each disposed above its corresponding MOS transistor Tr.

The MOS transistor Tr is configured by source/drain regions 43, and a gate electrode 44, which are formed in a region separated by an element separation layer 42 in the substrate 41. A side wall insulation layer is formed on the wall surface of the gate electrode 44. The gate electrode 44 serves also as a word line WL, which is one of two pieces of address wiring for the memory element 1. One of the source/drain regions 43 of the MOS transistor Tr is electrically connected to the lower electrode 10 of the memory element 1 via various layers, i.e., a plug layer 45, a metal wiring layer 46, and a plug layer 47. The other of the source/drain regions 43 of the MOS transistor Tr is connected to the metal wiring layer 46 via the plug layer 45. The metal wiring layer 46 is connected to a bit line BL (refer to FIG. 5), which is the remaining piece of the address wiring for the memory element 1. Note that, in FIG. 5, an active region 48 of the MOS transistor Tr is indicated by alternate long and short dashed lines. In the active region 48, contact sections 51 are connected to the lower electrode 10 of the memory element 1, and a contact section 52 is connected to the bit line BL.

In such a memory cell array, when a voltage is applied to the bit lines BL with the gate of the MOS transistor Tr turned ON by the word line WL, the voltage is directed to the lower electrode 10 of the selected memory cell via the source/drain regions 43 of the MOS transistor Tr. In this example, as for the voltage applied to the lower electrode 10, when the polarity thereof is at a negative potential compared with the potential of the upper electrode 30 (the plate electrode PL), the resistance value of the memory element 1 is changed in state to low resistance, whereby the selected memory cell is written with information. Next, when the potential of the voltage applied this time to the lower electrode 10 is positive compared with the potential of the upper electrode 30 (the plate electrode PL), the memory element 1 is changed in resistance state again to high, whereby the information written to the selected memory cell is erased. For reading of the written information, for example, a selection of memory cell is made by the MOS transistor Tr, and with respect to the selected memory cell, a predetermined level of voltage or current is applied. The current or voltage for application to the memory element 1 varies in level based on the resistance state of the memory element 1 at this time, and such varying values are detected via a sense amplifier or others connected to the tip of the bit line BL or of the plate electrode PL. Herein, the voltage or current applied to the selected memory cell is set to be smaller than the threshold value of the voltage or others at which the memory element 1 shows a change of the state of resistance value.

The memory element 1 of the first embodiment is applicable to various types of memory devices as described above. For example, the memory element applicable for use includes any types of memories such as once-writable PROM, electrically erasable EEPROM, or so-called RAM available for writing, erasing, and reproduction at a high speed.

In the below, described are a modification of the first embodiment described above, and a second embodiment. Any component similar to that of the first embodiment described above is provided with the same reference numeral, and is not described again.

[Modification]

Figure 4:
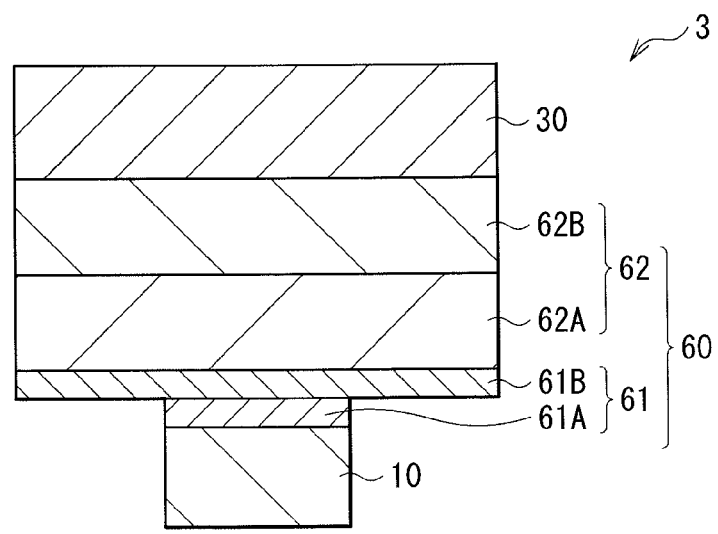
FIG. 4 is a cross-sectional diagram showing the configuration of a memory element according to a modification of the present disclosure.

FIG. 4 is a cross-sectional diagram showing the configuration of a memory element 2 according to a modification of the first embodiment of the present disclosure. The memory element 2 includes the lower electrode 10 (first electrode), a memory layer 60, and the upper electrode 30 (second electrode) in this order. The memory element 2 in this modification is different from the memory element 1 in the first embodiment in the respect that the memory layer 60 includes a plurality of resistance change layers 61 (two in this example). Note that an ion source layer 62 in this modification has the same structure as that in the first embodiment described above.

The resistance change layer 61 has the multi-layer structure of first and second resistance change layers 61A and 61B. These first and second resistance change layers 61A and 61B each serve as a barrier against electric conduction, and each have a resistance value higher than that of the ion source layer 62 and a different composition. Therefore, the memory element 2 and others do not vary that much in resistance value in the initial state or in the state of erasing. The memory element 2 is improved in resistance value retention characteristics during writing and erasing even if it is subjected to the operation of writing and erasing for a plurality of times.

The first and second resistance change layers 61A and 61B may be made of the materials exemplified for use to the resistance change layer 21 described in the first embodiment above. The material combination for the first and second resistance change layers 61A and 61B is not specifically restricted as long as their compositions are different. As an example, when the first resistance layer 61A contains an oxide or nitride of gadolinium oxide (GdOx) or others, the second resistance change layer 61B is preferably made of a compound mainly containing Te (AlTe, for example), and vice versa.

Although the function and effect of the memory element 2 in this modification are similar to those of the memory element 1 in the first embodiment described above, especially the following effect is produced because the resistance change layer is in the multi-layer structure including a plurality of layers (two layers in this example). First of all, since the formation of an oxide or nitride film is allowed at the time of erasing, this accordingly decreases a possibility of insulation deterioration that is caused by excessive voltage application at the time of erasing so that the repetition characteristics are expected to be improved thereby. Moreover, since the resistance range of a tellurium compound film available for use is adjustable as appropriate, this widens the selection range of materials for use. What is more, the variation of the memory elements 2 is decreased as described above, and the resistance value retention characteristics are improved. As such, the similar effect is produced to the memory device provided with such memory elements 2.

Second Embodiment

Figure 5A:
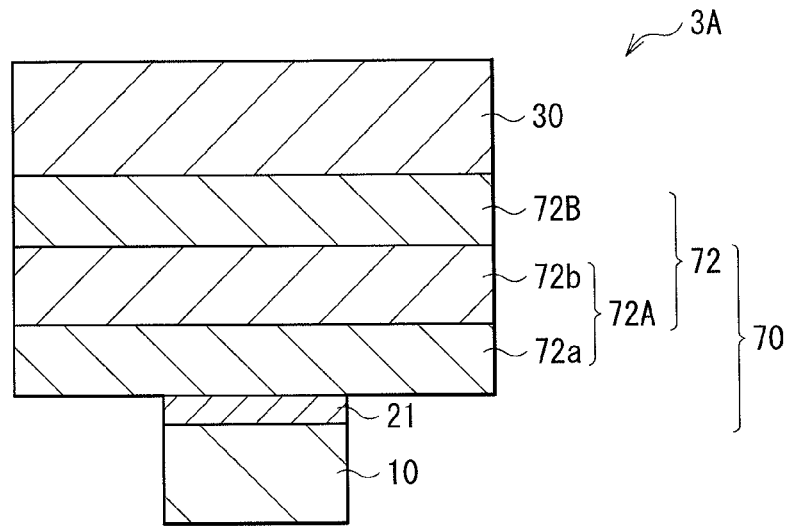
FIGS. 5A and 5B are each a cross-sectional diagram showing the configuration of a memory element according to a second embodiment of the present disclosure.
Figure 5B:
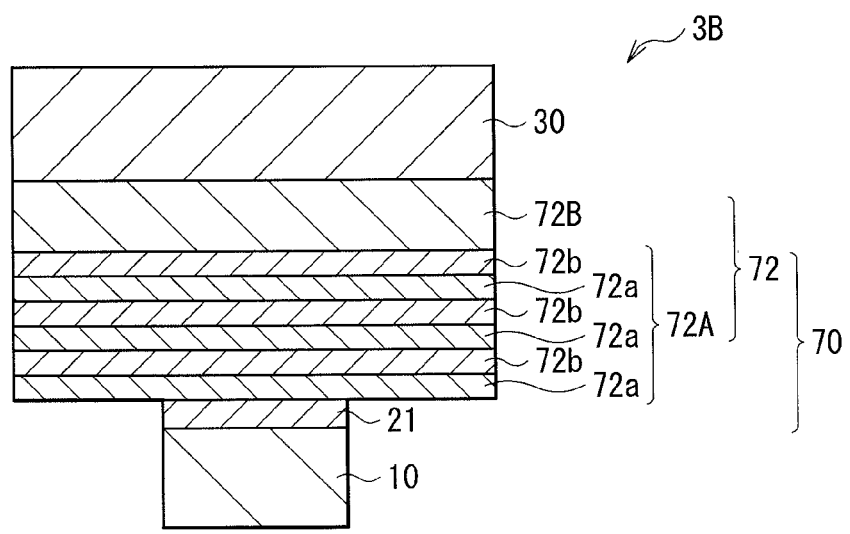

FIGS. 5A and 5B are cross-sectional diagrams respectively showing the configuration of memory elements 3A and 3B according to the second embodiment of the present disclosure. These memory elements 3A and 3B are each provided with the lower electrode (first electrode), a memory layer 70, and the upper electrode 30 (second electrode) in this order similarly to the memory element 1 in the first embodiment described above. The memory layer 70 is configured by a resistance change layer 71, and an ion source layer 72 including first and second ion source layers 72A and 72B. In comparison with the first embodiment, in the memory elements 3A and 3B in this second embodiment, the first ion source layer 72A includes a plurality of layers.

The first ion source layer 72A contains an element to be converted into movable ions (cations and anions) that diffuse to the resistance change layer 71, similarly to the second ion source layer 72B. In this embodiment, the first ion source layer 72A is in the multi-layer structure including first and second layers 72a and 72b. The first layer 72a contains an element that easily diffuses to the resistance change layer 21, in other words, an element that is easily converted into movable ions. On the other hand, the second layer 72b contains an element that does not easily diffuse to the first layer 72a and the resistance change layer 21, in other words, an element that is not easily converted into ions in the ion source layer 72. In this example, the first and second layers 72a and 72b are alternately stacked one on the other (FIG. 5A), but two or more pairs may be alternately stacked (FIG. 5B).

The first layer 72a contains, as an anionic component(s), one or more of chalcogen elements including tellurium (Te), sulfur (S), and selenium (Se), for example. As a cationic component(s), the first layer 72a contains one or more of elements (easy-to-move elements) that are easy to move in an electrolyte (the ion source layer 72 in this example). Such easy-to-move elements are those easily mixed with the chalcogen elements, and are specifically exemplified by Al or copper (Cu). In addition to the elements described above, the first layer 72a may contain germanium (Ge), zinc (Zn), and others. The chalcogen element(s) and the easy-to-move element(s) are bonded together in the first layer 72a, thereby forming a metal chalcogenide layer. This metal chalcogenide layer mainly has the amorphous structure, and serves as an ion supply source. The first layer 72a has the density distribution of the easy-to-move element(s), and this will be described in detail later.

The second layer 72b contains one or more of elements (difficult-to-move elements) that are difficult to move in the electrolyte (the ion source layer 72). Such difficult-to-move elements are those configuring the resistance change layer 21 and the ion source layer 72, especially those hardly reacting with a chalcogen element of Te, for example. The difficult-to-move elements are exemplified by elements of Groups 4 to 6 in the long-periodic table. These elements are specifically Ti, zirconium (Zr), hafnium (Hf), vanadium (V), niobium (Nb), Ta, Cr, Mo, and W. Other than these elements, the second layer 72b may contain additive elements of Cu, silver (Ag), Si, and others.

As described above, one or more first layers 72a and one or more second layers 72b are disposed one on the other in pairs. The order of layer stacking is not particularly restrictive, and as shown in FIG. 5A, layer stacking may be started with the first layer 72a from the resistance change layer 21 side, or with the second layer 72b. The number of pairs of the first and second layers 72a and 72b for stacking is not specifically restricted as long as the first ion source layer 72A has the film thickness of 6 nm or more similarly to the first ion source layer 22A in the first embodiment described above, but preferably, three or more pairs are preferably stacked alternately as shown in FIG. 5B. As described above, the first layer 72a has the density distribution of the easy-to-move element(s). To be specific, the density of the easy-to-move element(s) is relatively low on the bonded interface with the second layer 72b than that in the remaining region. In other words, compared with the middle portion of the first layer 72a in the thickness direction, the density of the easy-to-move element(s) is low or zero on the interface portion of the upper or lower surface being in contact with the second layer 72b. The easy-to-move element in the form of metal not reacting with the chalcogen element(s) in the first layer 72a is poor in adhesion with the difficult-to-move element(s) in the form of metal contained in the second layer 72b. Therefore, if the easy-to-move element in the form of metal is high in density on the interface between the first and second layers 72a and 72b, this easily causes film detaching and peeling. This means that, by reducing the density of the easy-to-move element on the interface of the first layer 72a in contact with the second layer 72b containing the difficult-to-move element in the form of metal as in the embodiment, the possibility of film detaching and peeling between the layers is decreased. Herein, how to adjust the density distribution of the easy-to-move element(s) observed in the first layer 72a will be described later in the process of manufacturing the ion source layer 72 below.

Described next is a film forming process of the first ion source layer 72A. After the layers up to the resistance change layer 21 are formed on the substrate, a chalcogen layer (layer A), a movable layer (layer B), and a fixed layer (layer C) are formed on the resistance change layer 21. The chalcogen layer contains one or more of chalcogen elements of tellurium (Te), sulfur (S), and selenium (Se). The movable layer contains one or more of the easy-to-move elements described above, and the fixed layer contains one or more of the difficult-to-move elements described above. To be specific, the layers are formed in succession through exchange of targets each with the composition in a device for sputtering. These layers, i.e., the chalcogen layer (layer A), the movable layer (layer B), and the fixed layer (layer C), are stacked like ABAC, BACA, CABA, or ACAB, for example. The resulting structure is counted as a unit, and stacking of one or more units, preferably stacking of three units or more is preferable. As a result, the first ion source layer 72A has the repeated stacking structure as shown in FIG. 5B. Therefore, by stacking the layers each made of an individual element in the first ion source layer 72A, the resulting first ion source layer 72A is provided with the satisfactory operation characteristics even if a film-forming device in use is not capable of co-sputtering, for example. Moreover, since the use of alloy target is not expected for the first ion source layer 72A, the manufacturing process is simplified, and the cost reduction is achieved.

Thereafter, the second ion source layer 72B different in composition from the first ion source layer 72A as described above, and then the upper electrode 30 are formed on the first ion source layer 72A by sputtering. As such, by forming the first ion source layer 72A in the multi-layer structure and then the second ion source layer 72B in the single-layer structure, the ion source layer 72 is not entirely formed by layer stacking any more so that the time for film formation is accordingly decreased.

After the formation of layers up to the upper electrode 30, a wiring layer (not shown) is formed for connection to the upper electrode 30, and a contact section is connected to achieve a common potential among all of the memory elements 1. Thereafter, the resulting multi-layer film is subjected to a post-annealing process.

By this post-annealing process, in the first ion source layer 72A including the chalcogen layer (layer A), the movable layer (layer B), and the fixed layer (layer C), the easy-to-move element(s) configuring the layer B diffuse into the layer A. This forms the density distribution of the easy-to-move element(s) in the first layer 72a described above. FIG. 6 schematically shows the layers before and after the post-annealing process in the first ion source layer 72A in which two multi-layer films each being a unit of ABAC are stacked. By the post-annealing process, the easy-to-move element(s) configuring the layer B diffuse into the layer A, thereby forming the first layer 72a. The difficult-to-move element(s) configuring the layer C do not diffuse easily, thereby forming an independent layer in the ion source layer 72, that is, the second layer 72b. In this manner, the memory elements 3A and 3B of FIGS. 5A and 5B are completed.

Note that the density gradient of the easy-to-move element(s) in the first layer 72a looks different depending on which layer (the layer A or C) is disposed above and below the layer B. As shown in (A) of FIG. 6, for example, when the layer B is sandwiched between the layers A, the easy-to-move element(s) diffuse into the layers A on both sides of the lower electrode 10 and the upper electrode 30, and as shown in (B) of FIG. 6, the density shows a gradual decrease in the vertical direction from the middle portion of the first layer 72a. Although not shown, with the layer stacking in order of ABC from the lower electrode 10 side, the density gradient of the easy-to-move element(s) in the first layer 72a shows a gradual increase from the lower electrode 10 side to the upper electrode 30 side. Moreover, to achieve a gradual degrease of the density gradient of the easy-to-move element(s) in the first layer 72a from the lower electrode 10 side to the upper electrode 30 side, the layers B and A may be stacked in this order.

As described above, in the memory elements 3A and 3B (and the method of manufacturing the same and the memory device) of this embodiment, by forming the layers, i.e., the chalcogen layer containing a chalcogen element (layer A), the movable layer containing an easy-to-move element (layer B), and the fixed layer containing a difficult-to-move element (layer C), the first ion source layer 72A is configured by one or more first layers 72a and one or more second layers 72b each with a different composition. The first layer 72a contains a chalcogen element and an easy-to-move element, and from the first to second electrode, has a density gradient of a metallic element that is possibly cationized. With the ion source layer 72 being partially in the multi-layer structure, produced is the effect of suppressing composition averaging in the ion source layer 72 that is caused by repeated operations of writing and erasing, in other words, the effect of further improving the repetition characteristics. This effect is produced in addition to the function and effect of the memory element 1 in the first embodiment described above, and is better than the stacking of uniform-composition layers each made of an individual element as in the memory elements 1 and 2 in the first embodiment and the modification thereof described above.

Moreover, the adhesion between layers is improved in the memory elements 3A and 3B so that the possibility of film detaching and peeling is reduced. In other words, the resulting memory device is with the improved yield and a high reliability. Further, by stacking of the layers each made of an individual element configuring the ion source layer 72, the resulting first ion source layer 72A is provided easily with the satisfactory operation characteristics. Still further, since the use of alloy target is not expected for formation of the first ion source layer 72A, the manufacturing process is simplified, and the cost reduction is achieved.

Exemplified in this embodiment is the first ion source layer 72A being in the multi-layer structure, and the second ion source layer 22B being in the single-layer structure (a uniform layer). Alternatively, the first ion source layer 72A may be in the single-layer structure, and the second ion source layer 72B may be in the multi-layer structure.

If this is the structure, similarly to the interface between the first and second layers 72a and 72b described above, the density of the easy-to-move element(s) is preferably low or zero in the form of metal on the surface where the ion source layer 72 and the upper electrode 30 are in contact with each other. This is because the easy-to-move element of Al or others in the first layer 72a does not easily react with the element in the upper electrode 30 compared with the chalcogen element. Therefore, if the easy-to-move element(s) in the first layer 72a are high in density on the surface in contact with the upper electrode 30, the resulting interface becomes unstable with the chalcogen element and the easy-to-move element(s). This results in film detaching and peeling of the upper electrode 30. Therefore, when the first layer 72a is in contact with the upper electrode 30, similarly to the structure in which the first layer 72a is in contact with the second layer 22B, adjusting the density of the easy-to-move element(s) in the first layer 72a increases the adhesion between the ion source layer 72 and the upper electrode 30, thereby reducing the possibility of film detaching and peeling between the layers.

When the second ion source layer 72B is in the multi-layer structure, in the manufacturing process thereof, when the stacking order of the chalcogen layer (layer A), the movable layer (layer B), and the fixed layer (layer C) is ACAB, after the ACAB unit is formed, the layer A is preferably provided additionally at the top end of the stacking structure. This prevents the direct contact between the upper electrode 30 and the layer B, to be specific, this prevents the easy-to-move element(s) from being dense on the interface between the ion source layer 72 and the upper electrode 30. This thus improves the adhesion between the ion source layer 72 and the upper electrode 30, thereby reducing the possibility of film detaching and peeling.

Described below are specific examples of the present disclosure. Various samples were manufactured as below with the structures of the memory elements 1, 2, 3A, and 3B in the embodiments described above, and their characteristics were examined

[Experiment 1]

[Samples 1-1 to 1-15]

As Samples 1-1 to 1-15, manufactured was the memory device of FIGS. 2 and 3. First of all, a MOS transistor Tr was formed on the semiconductor substrate 11. Next, an insulation layer was so formed as to cover the surface of the semiconductor substrate 11, and a via hole was formed in this insulation layer. Thereafter, by CVD (Chemical Vapor Deposition), the via hole was filled therein with an electrode material made of TiN, and the surface of the resulting via hole was made flat by CMP (Chemical Mechanical Polishing). Thereafter, by repeating such processes, a plug layer 45, a metallic wiring layer 46, a plug layer 47, and the lower electrode 10 were formed, and then the lower electrode 10 was subjected to patterning on the memory cell basis.

Next, the memory layer 20, and the upper electrode 30 were formed on the lower electrode 10 made of TiN using a device for sputtering. The diameter of the electrode was 50 to 300 nmϕ. Thereafter, the surface of the upper electrode 30 was subjected to etching, thereby forming a wiring layer (Al layer) with the thickness of 200 nm for a connection to a contact portion where an external circuit was connected for provision of an intermediate potential (Vdd/2). Next, as a post-annealing process, in a furnace for a vacuum heat treatment, the resulting structure was subjected to a heat treatment for two hours at the temperature of 320° C. The resulting structure was then subjected to microprocessing so that memory elements were manufactured (samples 1-1 to 1-15). In samples 1-1 to 1-15, the composition and the film thickness of "lower electrode/first resistance change layer/second resistance change layer/first ion source layer/second ion source layer/upper electrode" were "TiN/TiO$_2$ (plasma oxidation)/AlTeN/first ion source layer/second ion source layer/W (30 nm)". Table 1 shows the composition and the film thickness of the first ion source layer and those of the second ion source layer in each of the samples. Moreover, AlTeN was formed with the film thickness from 4 nm to 6 nm to equalize the initial resistance for the samples. Note here that Samples 1-1 to 1-15 were each in the 1-transistor-1-resistor (1T1R) configuration, and the size of the transistor was W/L=0.36/0.7 μm. A voltage was applied to have the drive current of about 75 μA, and about 50 μA (low current) so that the repetition characteristics were examined FIGS. 7A to 10C shows the results thereof

TABLE 1

| | First Ion Source Layer (nm) | Second Ion Source Layer (nm) |
|---|---|---|
| Sample 1-1 | Te41.6Al32.6Zr12.9Cu12.9 (60 nm) | — |
| Sample 1-2 | Te24Al39.5Zr16Cu16Ge4.5 (60 nm) (Film Formation in Oxygen Atmosphere) | — |
| Sample 1-3 | Te41.6Al32.6Zr12.9Cu12.9 (8 nm) | Te24Al39.5Zr16Cu16Ge4.5 (52 nm) (Film Formation in Oxygen Atmosphere) |
| Sample 1-4 | [Te(0.76 nm)/Al(0.71 nm)/Te(0.76 nm)/CuZr(0.45 nm)] × 3 | Te24Al39.5Zr16Cu16Ge4.5 (52 nm) (Film Formation in Oxygen Atmosphere) |
| Sample 1-5 | [Te(0.76 nm)/Al(0.71 nm)/Te(0.76 nm)/CuZr(0.45 nm)] × 22 | — |
| Sample 1-6 | [Te(0.76 nm)/Al(0.71 nm)/Te(0.76 nm)/CuZr(0.45 nm)] × 5 | Te36Al32Zr12.5Cu12.5Ge7 (46.5 nm) |
| Sample 1-7 | [Te(0.76 nm)/Al(0.71 nm)/Te(0.76 nm)/CuZr(0.45 nm)] × 3 | Te36Al32Zr12.5Cu12.5Ge7 (51.9 nm) |
| Sample 1-8 | [Te(0.76 nm)/Al(0.71 nm)/Te(0.76 nm)/CuZr(0.45 nm)] × 2 | Te36Al32Zr12.5Cu12.5Ge7 (54.6 nm) |
| Sample 1-9 | [Te(0.76 nm)/Al(0.71 nm)/Te(0.76 nm)/CuZr(0.45 nm)] × 1 | Te36Al32Zr12.5Cu12.5Ge7 (57.3 nm) |
| Sample 1-10 | [Te(0.78)/Al(0.71)/Cu(0.198)/Te(0.78)/Zr(0.209)] × 3 | Te36Al32Zr12.5Cu12.5Ge7 (51.9 nm) |
| Sample 1-11 | [Te(0.78)/Al(0.71)/Cu(0.198)/Te(0.78)/Zr(0.268)] × 3 | Te36Al32Zr12.5Cu12.5Ge7 (51.9 nm) |
| Sample 1-12 | [Te(0.78)/Al(0.71)/Te(0.78)/Cu(0.198)/Zr(0.209)] × 3 | Te36Al32Zr12.5Cu12.5Ge7 (51.9 nm) |
| Sample 1-13 | [Te(0.78)/Al(0.71)/Cu(0.187)/Te(0.78)/Hf(0.235)] × 3 | Te36Al32Zr12.5Cu12.5Ge7 (51.9 nm) |
| Sample 1-14 | [Te(0.78)/Al(0.82)/Cu(0.187)/Te(0.78)/Hf(0.235)] × 3 | Te36Al32Zr12.5Cu12.5Ge7 (51.9 nm) |
| Sample 1-15 | [Te(0.78)/Al(0.71)/Cu(0.208)/Te(0.78)/Hf(0.196)] × 3 | Te36Al32Zr12.5Cu12.5Ge7 (51.9 nm) |

[Assessment]

FIGS. 7A to 7D respectively show the repetition characteristics of Samples 1-1 to 1-4 at 75 μA (left) and at 50 μA (right). In Samples 1-1 and 1-2 in which the ion source layer 22 was in the single-layer structure, the memory element in Sample 1-1 operated at both drive currents of 75 μA and 50 μA, but the repetition characteristics of the memory element in Sample 1-2 were impaired. This seems due to the lower percentage of Te in the ion source layer in Sample 1-2 than that in Sample 1-1, and the higher percentage of the metallic element (Zr in this example) in the ion source layer in Sample 1-2 than that in Sample 1-1. As a result, the ion source layer in Sample 1-2 was decreased in resistance, and movable ions in the ion source layer were difficult to move due to a difficulty in application to the ion source layer during the operation. This seems to be the reason why the repetition characteristics of Sample 1-2 were impaired.

On the other hand, in Samples 1-3 and 1-4, the ion source layer was in the multi-layer structure including layers with a different content of Te (first and second ion source layers) as described in the embodiment or others in the above. In Samples 1-3 and 1-4, the first ion source layer was the layer having the same composition as the ion source layer in Sample 1-1, and the second ion source layer was the layer having the same composition as the ion source layer in Sample 1-2. The repetition characteristic in Samples 1-3 and 1-4 (FIGS. 7C and 7D) as such were operation characteristics satisfactory enough. With the memory element configured as above, as described in the foregoing, the metallic element(s) in the ion source layer move into the resistance change layer in response to application of a voltage thereto so that a conductive path is formed. This accordingly reduces the resistance value of the resistance change layer, and the state is change to low resistance. In Samples 1-3 and 1-4, the ion source layer was in the two-layer structure, and the first ion source layer provided on the resistance change layer side was with a high content of chalcogen element(s) whose resistance was higher than the metallic element. Therefore, the resistance of the ion source layer was increased in the vicinity of the resistance change layer, and the movable ions became nonconductive with ease even if the second ion source layer having a resistance value lower than that of the first ion source layer was stacked. This seems to be the reason why the repetition characteristics were not affected. Moreover, as to the operation mechanism of the memory devices (memory elements) in Samples 1-3 and 1-4 configured as described in the embodiments and others above, first of all, the movable ions in the vicinity of the resistance change layer (the first ion source layer) are supposed to move to the resistance change layer side in response to application of a voltage, and then the movable ions in the layer thereabove (the second ion source layer) are supposed to move to the resistance change layer side.

The metallic element such as Zr has a melting point higher than that of the chalcogen element such as Te. Therefore, in the second ion source layer with a higher content of Zr than in the first ion source layer but with a lower content of Te than in the first ion source layer, the crystallization temperature was increased, and this seems to make the entire ion source layer stable against Joule heat generated at the time of operation. Further, a high content of Zr seems to stabilize amorphousization, and improve the retention characteristics. Still further, by the film formation under the oxygen atmosphere, the second ion source layer is added with oxygen (O), thereby making higher the melting point.

Next, an assessment is made for Samples 1-5 to 1-9 in which the ion source layer is partially or entirely in the multi-layer structure. Herein, the first ion source layer has the multi-layer structure in Samples 1-5 to 1-9, but the composition of the entire first ion source layer is the same as that of the ion source layer in Sample 1-1. FIGS. 8A to 8E show the repetition characteristics of Samples 1-5 to 1-9. FIGS. 8A to 8C show that the first ion source layer is not restricted to be in the single-layer structure, and may be in the multi-layer structure as well. The results of FIGS. 8D and 8E show that, by forming the first ion source layer to have the film thickness of 5.3 nm or more, preferably 6 nm or more, and more preferably 8 nm or more, the operation characteristics are satisfactory enough even if the second ion source layer is changed in composition. Moreover, Samples 1-6 and 1-7 in which the ion source layer is partially in the multi-layer structure show the repetition operation characteristics equivalent to those of Sample 1-5 in which the ion source layer is entirely in the multi-layer structure. Therefore, as in Samples 1-6 and 1-7, with the ion source layer including both a multi-layer film (first ion source layer) and a single layer (second ion source layer), the time for film formation is considerably shortened while the repetition operation characteristics remain as they are. Herein, it is known that a high content of Ge in addition to a high content of Zr in the second ion source layer increases the crystallization temperature so that the memory element becomes more resistant to heat.

In Samples 1-10 to 1-12, the stacking order was changed for the multi-layer film configuring the ion source layer. By referring to FIGS. 9A to 9C showing the resulting repetition characteristics in Samples 1-10 to 1-12, it is known that changing the stacking order of the multi-layer film does not affect the operation characteristics of the memory element.

Also in Samples 1-13 to 1-15 in which Hf is used as an alternative to Zr, by referring to FIGS. 10A to 10C showing the repetition characteristics, it is known that the produced effect is equivalent to that in Samples 1-3, 1-4, and 1-6, for example. This shows that, even if the metallic element other than Te is changed in type and composition, as long as the range is within that described in the above embodiments and others, the similar effect is to be produced.

(Experiment 2)

Next, manufactured was the memory device (Samples 2-1 to 2-3) in which the structure of the resistance change layer is different from that in Samples described above. The memory device was manufactured similarly to that in Samples 1-1 to 1-15 described above, and their repetition characteristics were measured. In samples 2-1 to 2-3, the composition and the film thickness of "lower electrode/first resistance change layer/second resistance change layer/first ion source layer/second ion source layer/upper electrode" were "TiN/AlOx (1 nm) (plasma oxidation)/AlTeN/first ion source layer/second ion source layer/W (30 nm)". Table 2 shows the composition of the first ion source layer and that of the second ion source layer.

TABLE 2

|  | First Ion Source Layer (nm) | Second Ion Source Layer (nm) |
|---|---|---|
| Sample 2-1 | Te36.2Al37.6Zr13.1Cu13.1 (45 nm) |  |
| Sample 2-2 | [Te(0.706)/Al(0.847)/ Te(0.706)/CuZr(0.469)] × 3 | Te31Al37Zr13Cu13Ge6 (42.3 nm) |
| Sample 2-3 | [Te(0.706)/Al(0.847)/ Te(0.706)/CuZr(0.469)] × 1 | Te31Al37Zr13Cu13Ge6 (36.9 nm) |

FIGS. 11A to 11C show the repetition characteristics of Samples 2-1 to 2-3, respectively. In Samples 2-1 to 2-3, the composition ratio of Te is almost the same, and in Samples 2-2 and 2-3, the first and second ion source layers have the same composition except the number of layers in the first ion source layer. The repetition characteristics in FIG. 11A (Sample 2-1) and FIG. 11B (Sample 2-2) are almost the same, and are almost the same as those of Sample 1-3 described above. On the other hand, in FIG. 11C (Sample 2-3), the repetition characteristics are impaired. This shows that the material and structure of the resistance change layer are arbitrary, and the effect produced by the embodiments and others depends on the structure of the ion source layer.

While the present disclosure has been described in detail by referring to the first and second embodiments, Modification, and Examples, the present disclosure is not restrictive to the embodiments and others described above, and numerous other modifications may be possibly devised.

For example, in the embodiments and others described above, the configurations of the memory elements 1 and 2, and that of the memory cell array are specifically described. However, all of the layers are not necessarily provided, or any other layers may be also provided.

Further, for example, the materials of the layers, the film-forming methods and condition, and others described in the embodiments and others above are surely not restrictive, and any other materials, or any other film-forming methods will also do. For example, the ion source layer 22 may be added with any other types of transition metallic element such as Ti, Hf, V, Nb, Ta, Cr, Mo, or W as long as the composition ratio described above remains the same, and Cu, Ag, and zinc (Zn) are surely not restrictive, and nickel (Ni) or others may be added.

Still further, in the second embodiment or others described above, in the process of manufacturing the first ion source layer 72A (or the second ion source layer 72B) in the multi-layer structure, the film formation is so performed that the layers A and B being the first layer 72a and the layer C being the second layer 72b are in the repeated stacking structure. However, the stacking order does not necessarily remain the same. To be specific, the order of layer stacking is not restricted as long as the layers C and B are not directly in contact with each other, and the layer B is not at the top end of the resulting structure.

Still further, in the embodiments and others described above, the ion source layer 22 is in the multi-layer structure including layers with a different composition (first and second ion source layers 22A and 22B). Alternatively, the ion source layer 22 may be in the single-layer structure, and in this ion source layer, the element of Te or others may have a density gradient from the lower electrode 10 to the upper electrode 30. This seems to produce the effect of making the ion source layer 22 resistant to deterioration by heat, and improving the data retention characteristics although the produced effect thereby is not good enough as that produced in the embodiments and others described above.

The present technology is also possibly in the following structures.

(1) A memory element, including:
a first electrode, a memory layer, and a second electrode in this order, wherein
the memory layer includes
a resistance change layer provided on the first electrode side, and
an ion source layer containing one or more of metallic elements, and the ion source layer being provided on the second electrode side, and
the ion source layer includes a first ion source layer and a second ion source layer, the first ion source layer containing one or more of chalcogen elements of tellurium (Te), sulfur (S), and selenium (Se) and being provided on the resistance change layer side, and the second ion source layer containing the chalcogen element with a content different from a content in the first ion source layer and being provided on the second electrode side.

(2) The memory element according to (1), wherein
the first ion source layer includes one or more first layers and one or more second layers, the first layer containing one or more of the chalcogen elements of tellurium (Te), sulfur (S), and selenium (Se) and an easy-to-move element that is easy to move in the memory layer, and having a density gradient of the easy-to-move element from the first electrode to the second electrode, and the second layer containing a difficult-to-move element that is difficult to move in the memory layer.

(3) The memory element according to (1), wherein
the metallic element is one or more of copper (Cu), aluminum (Al), germanium (Ge), and zinc (Zn).

(4) The memory element according to (1), wherein
the metallic element is one or more in a transition metal group of titanium (Ti), zirconium (Zr), hafnium (Hf), vanadium (V), niobium (Nb), tantalum (Ta), chromium (Cr), molybdenum (Mo), and tungsten (W).

(5) The memory element according to any one of (1) to (4), wherein
the content of the chalcogen element in the second ion source layer is lower than the content of the chalcogen element in the first ion source layer.

(6) The memory element according to any one of (1) to (5), wherein
a content of one or more of the metallic elements of copper (Cu), aluminum (Al), germanium (Ge), and zinc (Zn) in the second ion source layer is higher than a content of one or more of the metallic elements in the first ion source layer.

(7) The memory element according to any one of (1) to (6), wherein
a content of one or more of the metallic elements in a transition metal group of titanium (Ti), zirconium (Zr), hafnium (Hf), vanadium (V), niobium (Nb), tantalum (Ta), chromium (Cr), molybdenum (Mo), and tungsten (W) in the second ion source layer is higher than a content of one or more of the metallic elements in the first ion source layer.

(8) The memory element according to any one of (1) to (7), wherein
a melting point of the second ion source layer is higher than a melting point of the first ion source layer.

(9) The memory element according to any one of (1) to (8), wherein
a resistance value of the second ion source layer is lower than a resistance value of the first ion source layer.

(10) The memory element according to any one of (1) to (9), wherein
a content of oxygen (O) in the second ion source layer is larger than a content of oxygen in the first ion source layer.

(11) The memory element according to any one of (1) to (10), wherein
the first ion source layer has a density gradient of a chalcogen element from the first electrode side to the second electrode side.

(12) The memory element according to any one of (2) to (11), wherein
a melting point of the second ion source layer is higher than a melting point of a layer, the layer being one of a plurality of layers configuring the first ion source layer and being in contact with the resistance change layer.

(13) The memory element according to any one of (2) to (12), wherein
a resistance value of the second ion source layer is lower than a resistance value of a layer, the layer being one of a plurality of layers configuring the first ion source layer and being in contact with the resistance change layer.

(14) The memory element according to any one of (1) to (13), wherein
a resistance value shows a change by formation of a low-resistance section containing the metallic element in the resistance change layer in response to application of a voltage to the first and second electrodes.

(15) A memory device, including:
a plurality of memory elements each including a first electrode, a memory layer, and a second electrode in this order; and
a pulse application section applying a voltage or current pulse selectively to the memory elements, wherein
the memory layer includes
a resistance change layer provided on the first electrode side, and
an ion source layer containing one or more of metallic elements, and the ion source layer being provided on the second electrode side, and
the ion source layer includes a first ion source layer and a second ion source layer, the first ion source layer containing one or more of chalcogen elements of tellurium (Te), sulfur (S), and selenium (Se) and being provided on the resistance change layer side, and the second ion source layer containing the chalcogen element with a content different from a content in the first ion source layer and being provided on the second electrode side.

(16) A method of manufacturing a memory element, the method including:
forming a first electrode on a substrate;
forming a resistance change layer on the first electrode;
forming, on the resistance change layer, a first ion source layer containing a metallic element and one or more of chalcogen elements of tellurium (Te), sulfur (S), and selenium (Se);
forming, on the first ion source layer, a second ion source layer containing the chalcogen element with a content different from a content in the first ion source layer; and
forming a second electrode on the first ion source layer.

(17) The method according to (16), wherein
the first ion source layer includes one or more chalcogen layers, one or more movable layers, and one or more fixed layers, the chalcogen layer containing one or more of chalcogen elements of tellurium (Te), sulfur (S), and selenium (Se), the movable layer containing one or more of easy-to-move elements that are easy to move in an electrolyte, and the fixed layer containing one or more of difficult-to-move elements that are difficult to move in the electrolyte, and the first ion source layer being partially in a multi-layer structure of the chalcogen layer, the movable layer, and the chalcogen layer in this order.

(18) The method according to (16) or (17), wherein
after the second electrode is formed, a heat treatment is performed to form a mixture layer of the chalcogen layer and the movable layer.

(19) The method according to any one of (16) to (18), wherein
among the chalcogen layer, the movable layer, and the fixed layer, two or more layers of at least the chalcogen layer are included, and a part or more thereof is in a multi-layer structure including the chalcogen layer, the movable layer, and the chalcogen layer in this order.

The present disclosure contains subject matter related to that disclosed in Japanese Priority Patent Application JP 2011-146113 filed in the Japan Patent Office on Jun. 30, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A memory element, comprising:
a first electrode, a memory layer, and a second electrode in this order, the memory layer including (i) a resistance change layer provided on the first electrode side and (ii) an ion source layer containing a plurality of metallic elements, the ion source layer being provided on the second electrode side,
wherein,
the ion source layer includes a first ion source layer and a second ion source layer, the first ion source layer containing one or more of chalcogen elements of tellurium (Te), sulfur (S), and selenium (Se) and being provided on the resistance change layer side, and the second ion source layer containing the chalcogen element with a content different from a content in the first ion source layer and being provided on the second electrode side,
the first ion source layer has a multi-layer structure made up of one or more first layers and one or more second layers, the one or more first and second layers being alternately stacked one upon another,
each first layer of the first ion source layer contains the one or more of chalcogen elements and at least one first metallic element,
each second layer of the first ion source layer contains at least one second metallic element that is different from the at least one first metallic element and, relative to the at least one first metallic element, is difficult to move as an ion in the memory layer, and
in a thickness direction of the memory element, a density distribution of the at least one first metallic element in each first layer is such that, relative to a density of the at least one first metallic element in a middle portion of the first layer, a density of the at least one first metallic element on an interface between the first layer and the second layer is low or zero.

2. The memory element according to claim 1, wherein the at least one first metallic element is at least one element selected from the group consisting of copper (Cu) and aluminum (Al).

3. The memory element according to claim 1, wherein the at least one second metallic element is at least one element in a transition metal group of titanium (Ti), zirconium (Zr), hafnium (Hf), vanadium (V), niobium (Nb), tantalum (Ta), chromium (Cr), molybdenum (Mo), and tungsten (W).

4. The memory element according to claim 1, wherein the content of the chalcogen element in the second ion source layer is lower than the content of the chalcogen element in the first ion source layer.

5. The memory element according to claim 1, wherein a resistance value of the second ion source layer is lower than a resistance value of one of the layers that make up the first ion source layer and that is in contact with the resistance change layer.

6. The memory element according to claim 1, wherein a resistance value of the resistance change layer changes in response to an application of a voltage to the first and second electrodes.

7. The memory element according to claim 1, wherein a film thickness of the first ion source layer is equal to or greater than 6 nm.

8. The memory element according to claim 1, wherein a film thickness of the first ion source layer is equal to or greater than 8 nm.

9. The memory element according to claim 2, wherein each first layer in the first memory layer further includes at least one of germanium (Ge) and zinc (Zn).

10. The memory element according to claim 3, wherein each second layer in the first memory layer further includes at least one of copper (Cu), silver (Ag), and silicon (Si).

11. The memory element according to claim 1, wherein the second ion source layer has a single-layer structure.

12. The memory element according to claim 1, wherein the density of the at least one first metallic element gradually decreases from the middle portion of the first layer to the interface between the first layer and the second layer.

* * * * *